United States Patent
Lee et al.

(10) Patent No.: US 12,538,799 B2
(45) Date of Patent: Jan. 27, 2026

(54) SEMICONDUCTOR DEVICE AND METHODS OF MAKING AND USING THERMALLY ADVANCED SEMICONDUCTOR PACKAGES

(71) Applicant: STATS ChipPAC Pte. Ltd., Singapore (SG)

(72) Inventors: Hyun-kyu Lee, Incheon (KR); Ji-seon Lee, Incheon (KR); Bum-ryul Maeng, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 425 days.

(21) Appl. No.: 17/936,075

(22) Filed: Sep. 28, 2022

(65) Prior Publication Data

US 2024/0105551 A1   Mar. 28, 2024

(51) Int. Cl.
*H01L 23/473* (2006.01)
*H01L 21/48* (2006.01)
*H01L 21/56* (2006.01)
*H01L 23/31* (2006.01)
*H01L 23/44* (2006.01)

(52) U.S. Cl.
CPC ........ *H01L 23/473* (2013.01); *H01L 21/4871* (2013.01); *H01L 21/56* (2013.01); *H01L 23/315* (2013.01); *H01L 23/44* (2013.01)

(58) Field of Classification Search
CPC ..... H01L 23/473; H01L 23/315; H01L 23/44; H01L 21/4871; H01L 21/56
See application file for complete search history.

(56) References Cited

U.S. PATENT DOCUMENTS

| | | | |
|---|---|---|---|
| 6,964,889 B2 | 11/2005 | Ma et al. | |
| 9,431,316 B2* | 8/2016 | Pagaila | H01L 23/36 |
| 2016/0005682 A1* | 1/2016 | Leal | H01L 21/565 |
| | | | 257/712 |
| 2018/0219002 A1* | 8/2018 | Bitz | H01L 23/46 |
| 2019/0385931 A1* | 12/2019 | Eid | H01L 23/3677 |
| 2020/0111752 A1* | 4/2020 | Chen | H01L 23/49811 |
| 2020/0350180 A1* | 11/2020 | Yen | H01Q 1/526 |
| 2021/0028122 A1 | 1/2021 | Son et al. | |
| 2021/0183812 A1* | 6/2021 | Ghosh | H01L 23/473 |
| 2022/0157689 A1* | 5/2022 | Chen | H01L 23/552 |
| 2022/0216128 A1* | 7/2022 | Zhang | H01L 24/73 |
| 2022/0238408 A1 | 7/2022 | Yu et al. | |
| 2023/0253288 A1* | 8/2023 | Adebiyi | H01L 25/0655 |
| | | | 257/687 |
| 2024/0063079 A1* | 2/2024 | Shao | H01L 23/3675 |

* cited by examiner

*Primary Examiner* — Davienne N Monbleau
*Assistant Examiner* — Heim Kirin Grewal
(74) *Attorney, Agent, or Firm* — Brian M. Kaufman; Robert D. Atkins; PATENT LAW GROUP: Atkins and Associates, P.C.

(57) ABSTRACT

A semiconductor device includes a substrate. A semiconductor die is disposed over the substrate. An encapsulant is deposited over the substrate and semiconductor die. A first trench is formed in the encapsulant over the semiconductor die. A conductive layer is formed over the encapsulant and into the first trench.

16 Claims, 10 Drawing Sheets

SEMICONDUCTOR DEVICE AND METHODS OF MAKING AND USING THERMALLY ADVANCED SEMICONDUCTOR PACKAGES

FIELD OF THE INVENTION

The present invention relates in general to semiconductor devices and, more particularly, to a semiconductor device and methods of making and using thermally advanced semiconductor packages.

BACKGROUND OF THE INVENTION

As semiconductor devices become faster and denser, the amount of thermal energy being generated grows. Handling the thermal emission of semiconductor die with the increasingly advanced semiconductor packages being demanded is a never-ending race. Thermal management is critical and presents a design challenge when the power dissipation magnitudes and the level of complexity in package architectures increases. Exploring integrated thermal management is needed to ensure the performance and reliability of high-power components. Currently available methods and package structures are reaching their limits and are becoming insufficient.

Therefore, a need exists for a thermally advanced semiconductor package.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices. The terms "semiconductor die" and "die" are used interchangeably.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
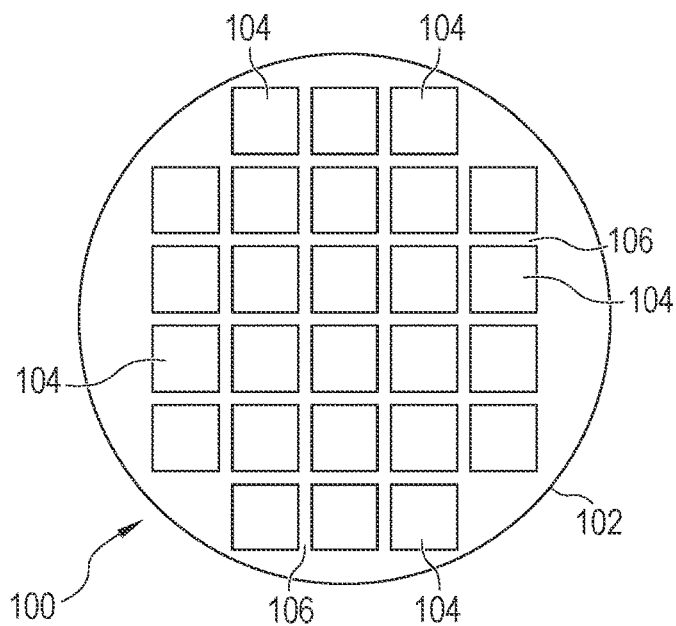
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
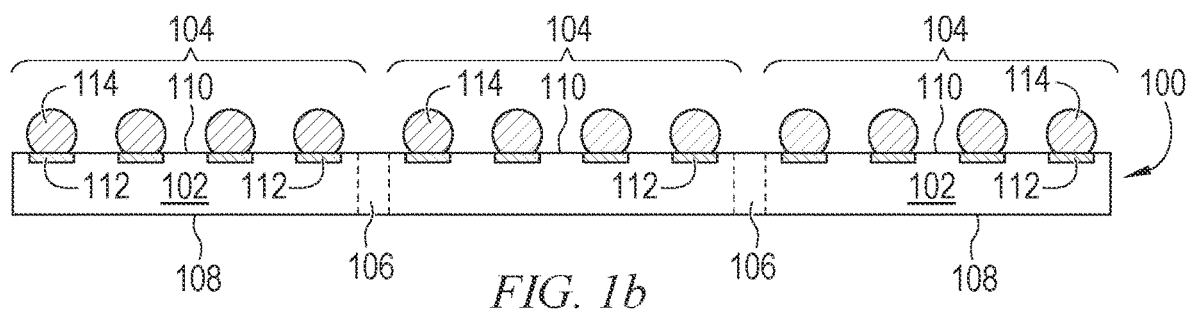

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
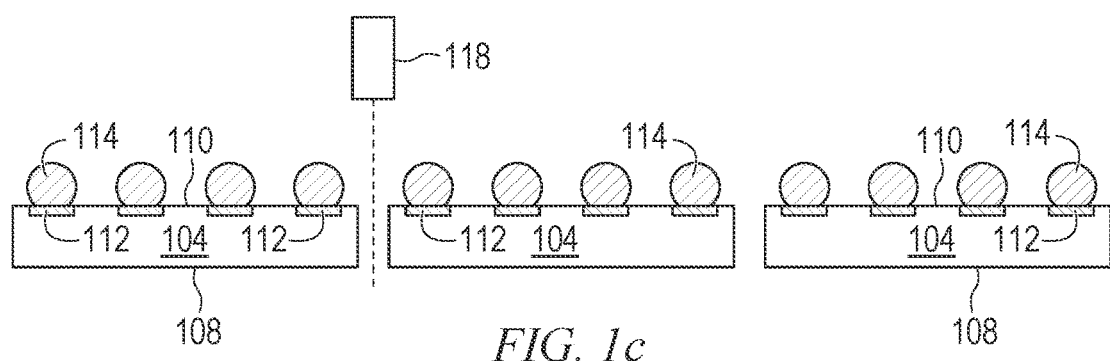

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
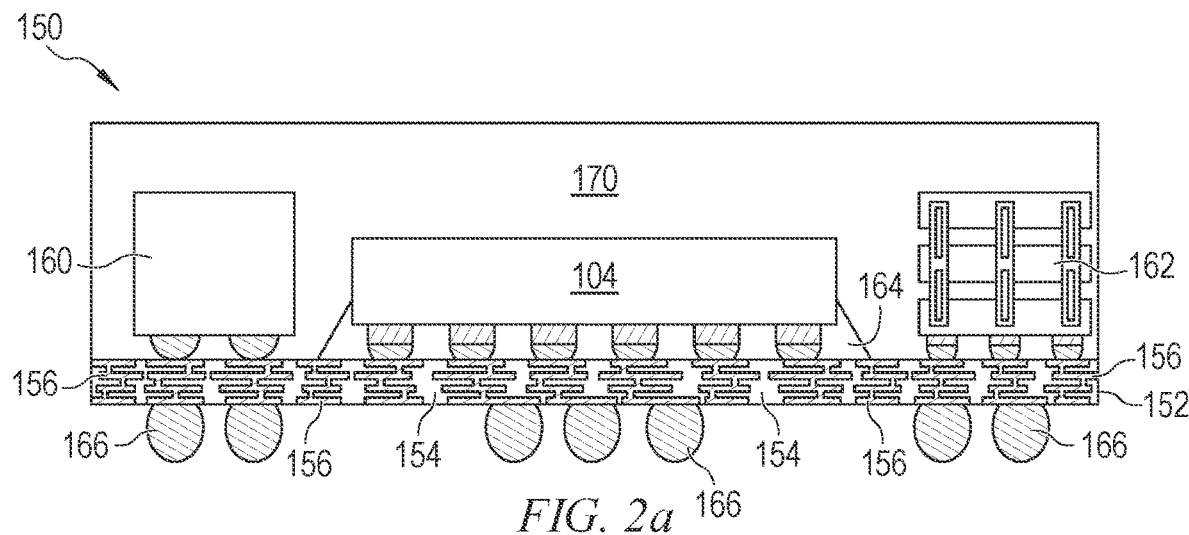
FIGS. 2a-2d illustrate forming a thermally advanced semiconductor package.
Figure 2B:
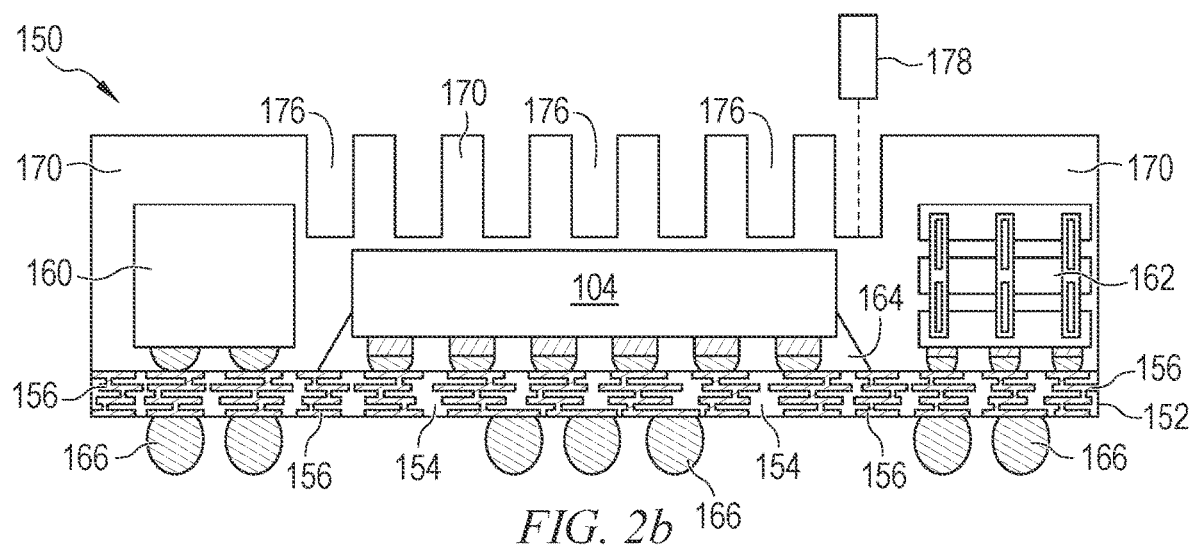
Figure 2C:
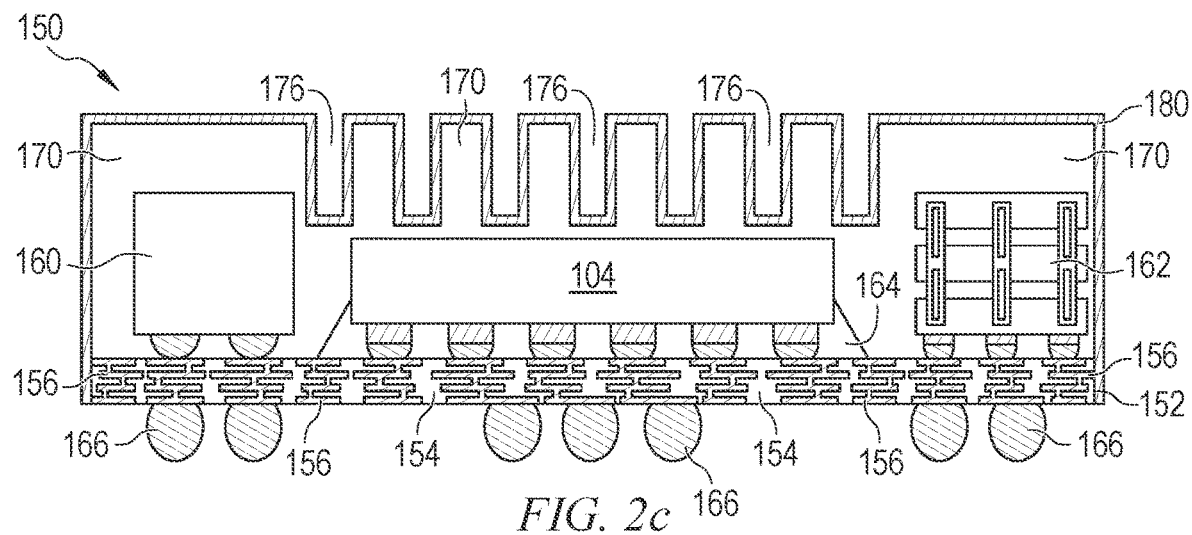

FIGS. 2a-2c illustrate manufacturing a semiconductor package 150 with semiconductor die 104 and having an advanced cooling structure. FIG. 2a shows semiconductor package 150 being formed over a substrate 152. While only a single substrate 152 is shown, hundreds or thousands of substrates are commonly processed on a common carrier, using the same steps described herein for a single unit but performed en masse. Substrate 152 could also start out as a single large substrate for multiple units, which are singulated from each other during or after the manufacturing process.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Forming semiconductor package 150 begins with mounting semiconductor die 104, discrete components 160, die stack 162, other discrete active or passive components, additional semiconductor die, and any other desired components to substrate 152. Any number, type, and combination of semiconductor die and other electrical components can be used to make package 150.

Solder bumps 114 are reflowed between semiconductor die 104 and substrate 152 to mechanically and electrically connect the semiconductor die to the substrate. A mold underfill 164 is dispensed onto substrate 152 or semiconductor die 104 prior to mounting of the semiconductor die. In other embodiments, mold underfill 164 is dispensed between semiconductor die 104 and substrate 152 after mounting. Semiconductor die 104 is connected to discrete component 160 and die stack 162 through conductive layer 156.

Solder paste or a plurality of solder bumps is used to electrically and mechanically couple discrete component 160 and die stack 162 to conductive layer 156. Any combination of discrete active and passive components can be mounted as desired. Any type and number of components can also be mounted onto either the top surface of substrate 152, the bottom surface, or both, and also embedded within the substrate in any suitable order and configuration.

Solder bumps 166 or another suitable interconnect structure are mounted onto the bottom of substrate 152 for subsequent integration of semiconductor package 150 into a larger electrical system. Solder bumps 166 can be applied at any stage of the manufacturing process.

After mounting of semiconductor die 104 and any other desired electrical components onto substrate 152, the components are encapsulated by encapsulant or molding compound 170. Encapsulant 170 is deposited over substrate 152 and semiconductor die 104 using paste printing, compressive molding, transfer molding, liquid encapsulant molding, vacuum lamination, spin coating, or another suitable applicator. Encapsulant 170 can be polymer composite material, such as epoxy resin, epoxy acrylate, or polymer with or without a filler. Encapsulant 170 is non-conductive, provides structural support, and environmentally protects the semiconductor device from external elements and contaminants. Encapsulant 170 completely covers side surfaces of semiconductor die 104 and fills any gaps between substrate 152 and semiconductor die 104 if a separate mold underfill 164 is not used. In some embodiments, encapsulant 170 is deposited while substrate 152 remains as a wafer or strip with multiple packages being formed at once, and then substrate 152 is singulated along with the encapsulant.

In FIG. 2b, a plurality of recesses, cavities, slots, or trenches 176 is formed into encapsulant 170 by laser ablation using laser 178. In other embodiments, trenches 176 are formed by sawing, plasma etching, chemical etching, or other suitable techniques. Trenches 176 selectively thin encapsulant 170 over semiconductor die 104, reducing the thickness of encapsulant over the semiconductor die where the trenches are formed. In one embodiment, trenches 176 are formed completely through encapsulant 170 to expose a back surface of semiconductor die 104. Trenches 176 may also be formed partially into or completely through semiconductor die 104.

Trenches 176 are formed as elongated slots extending toward and away from the viewer of FIG. 2b for the length or width of semiconductor die 104, or for the entire length or width of package 150. In other embodiments, trenches 176 are circular, square, or other smaller shape formed in a grid or other pattern over and across the footprint of semiconductor die 104.

In FIG. 2c, a conductive material is sputtered over package 150 to form a conductive shielding layer 180. Shielding layer 180 is formed using any suitable metal deposition technique, e.g., PVD, CVD, other sputtering methods, spraying, or plating. The sputtered material can be copper, steel, aluminum, gold, combinations thereof, or any other suitable conductive material. In some embodiments, shielding layer 180 can be made by sputtering on multiple layers of differing material, e.g., stainless steel-copper-stainless steel or titanium-copper.

Shielding layer 180 is a conformal layer that has a substantially uniform thickness on each exposed surface of encapsulant 170. The bottom surface and vertical sidewalls within trenches 176 have a coating of shielding layer 180 while the remainder of the trenches remains empty of significant solid matter. In some embodiments, trenches 176 are formed completely through encapsulant 170 to expose the top surface of semiconductor die 104, in which case shielding layer 180 is formed down to and directly physically contacting the semiconductor die.

Shielding layer 180 reduces EMI between the components of package 150 and other nearby electronic devices. Shielding layer 180 is optionally connected to a ground voltage node through conductive layers 156 to improve EMI reduction. Shielding layer 180 can be connected to conductive layer 156 by sputtering the shielding layer onto an exposed side surface of substrate 152 where the conductive layer is exposed. In addition to shielding of EMI radiation, shielding layer 180 also operates to reduce thermal resistance vertically along the walls of trenches 176 between semiconductor die 104 and the top surface of encapsulant 170. Shielding layer 180 is thermally conductive and efficiently transfers thermal energy from semiconductor die 104.

Semiconductor package 150 with trenches 176 and shielding layer 180 can be used as a conventional heatsink. Trenches 176 increase the exposed surface area for thermal dissipation similar to a heatsink. Moreover, the depth of trenches 176 brings shielding layer 180 physically closer to semiconductor die 104, which reduces thermal resistance between the semiconductor die and the shielding layer. Both the additional surface area and reduced encapsulant thickness increase thermal conductivity, which is desired for sufficient cooling of semiconductor die 104. Moreover, shielding layer 180 is brought close to or contacting semiconductor die 104 without having to utilize a special molding process, e.g., film-assisted molding, to expose the semiconductor die or backgrinding to reduce a thickness of the encapsulant. Semiconductor package 150 can be used in the form shown in FIG. 2c, with trenches 176 and shielding layer 180 operating as a heatsink, which reduces the cost and manufacturing complexity of creating a package structure with a separate heatsink having to be applied.

Figure 2D:
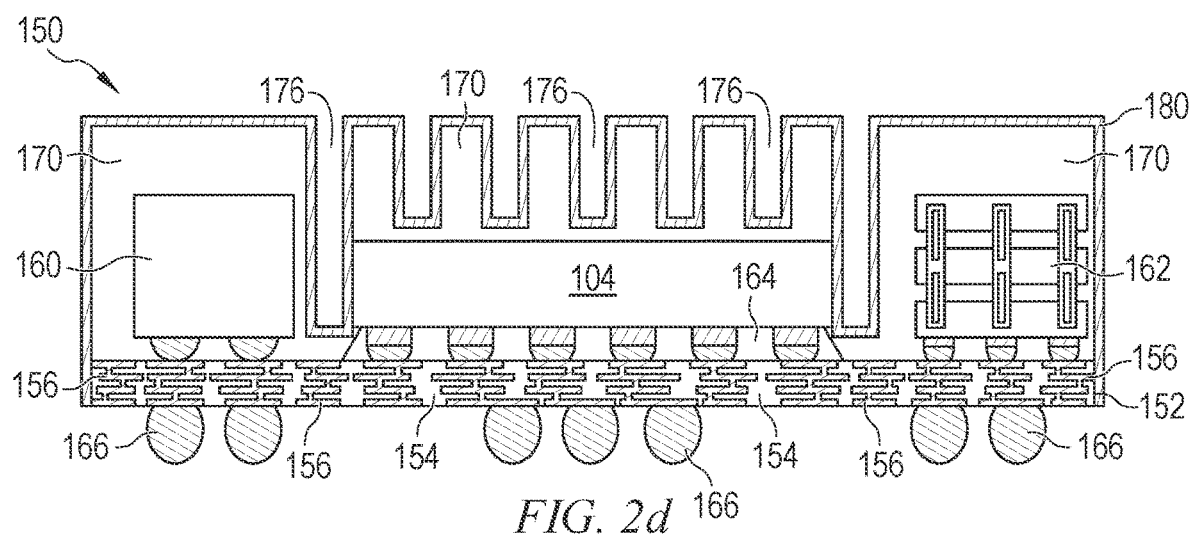

FIG. 2d illustrates another embodiment where trenches 176 outside the footprint of semiconductor die 104 are formed deeper into encapsulant 170. Trenches 176 are formed near or touching side surfaces of semiconductor die 104, increasing the surface area of shielding layer 180 in close proximity to the semiconductor die. Deep trenches 176 around semiconductor die 104 increase efficiency of thermal transfer between the semiconductor die and shielding layer 180 by increasing said surface area. In another embodiment, trenches 176 are formed completely to substrate 152.

Figure 3A:
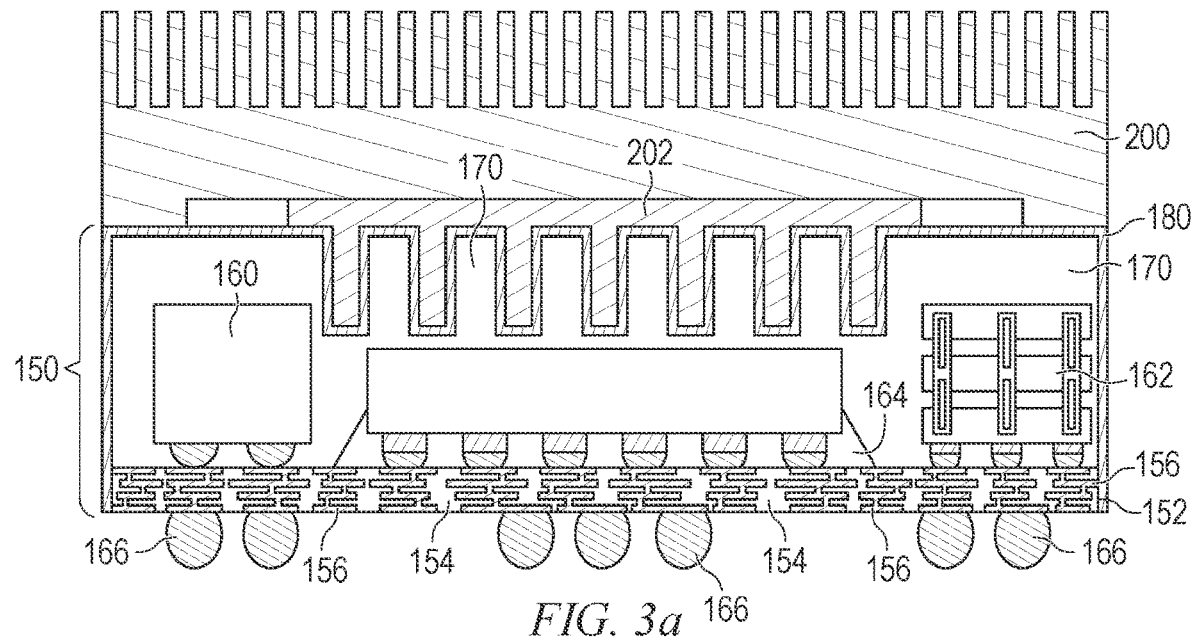
FIGS. 3a and 3b illustrate cooling options for the thermally advanced semiconductor package.
Figure 3B:
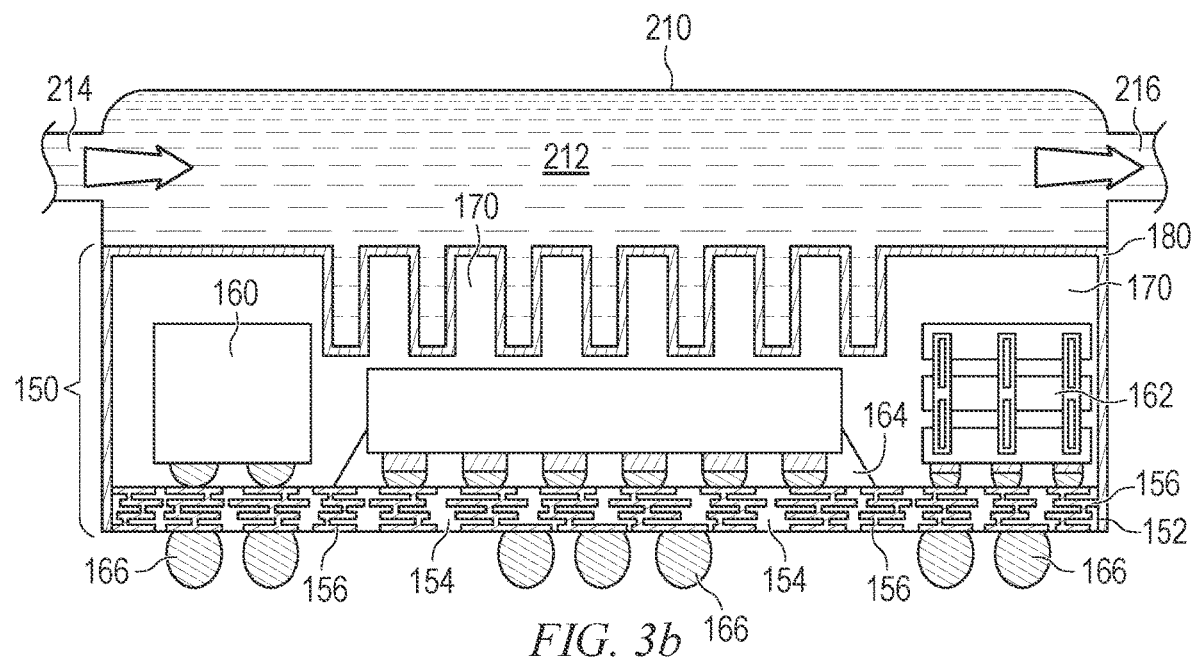

Semiconductor package 150 also provides additional cooling options as illustrated in FIGS. 3a and 3b. FIG. 3a shows heatsink 200 mounted onto package 150 with a thermal interface material (TIM) 202. TIM 202 physically contacts shielding layer 180 and heatsink 200 to enhance thermal coupling between them. TIM 202 penetrates into and fills trenches 176 to provide a good thermal interface between shielding layer 180 and heatsink 200. In some embodiments, TIM 202 is also an adhesive to physically couple heatsink 200 to semiconductor package 150. Any suitable thermal interface material can be used. Heatsink 200 allows a larger thermal dissipation surface area than trenches 176 alone by allowing a bigger footprint in all directions, taller fins, more options for density and shape of fins, etc. In some embodiments, a footprint of heatsink 200 is larger than a footprint of package 150.

FIG. 3b illustrates a water-cooled embodiment. A watertight chamber 210 is formed over package 150 with shielding layer 180 forming part of the chamber. Chamber 210 is formed or disposed with a seal against shielding layer 180 to keep water contained within the chamber from escaping and running onto nearby electronic devices. Water 212 or another suitable coolant is pumped into inlet 214 and then exits via outlet 216 in a circuit. An optional protection layer can be formed over EMI shield 180. The protection layer protects shielding layer 180 from corrosion due to water 212. The protection layer can be a polymer material, a different metal less susceptible to corrosion, or another suitable material. The protection layer can be sputtered in a similar manner to shielding layer 180.

Figure 5:
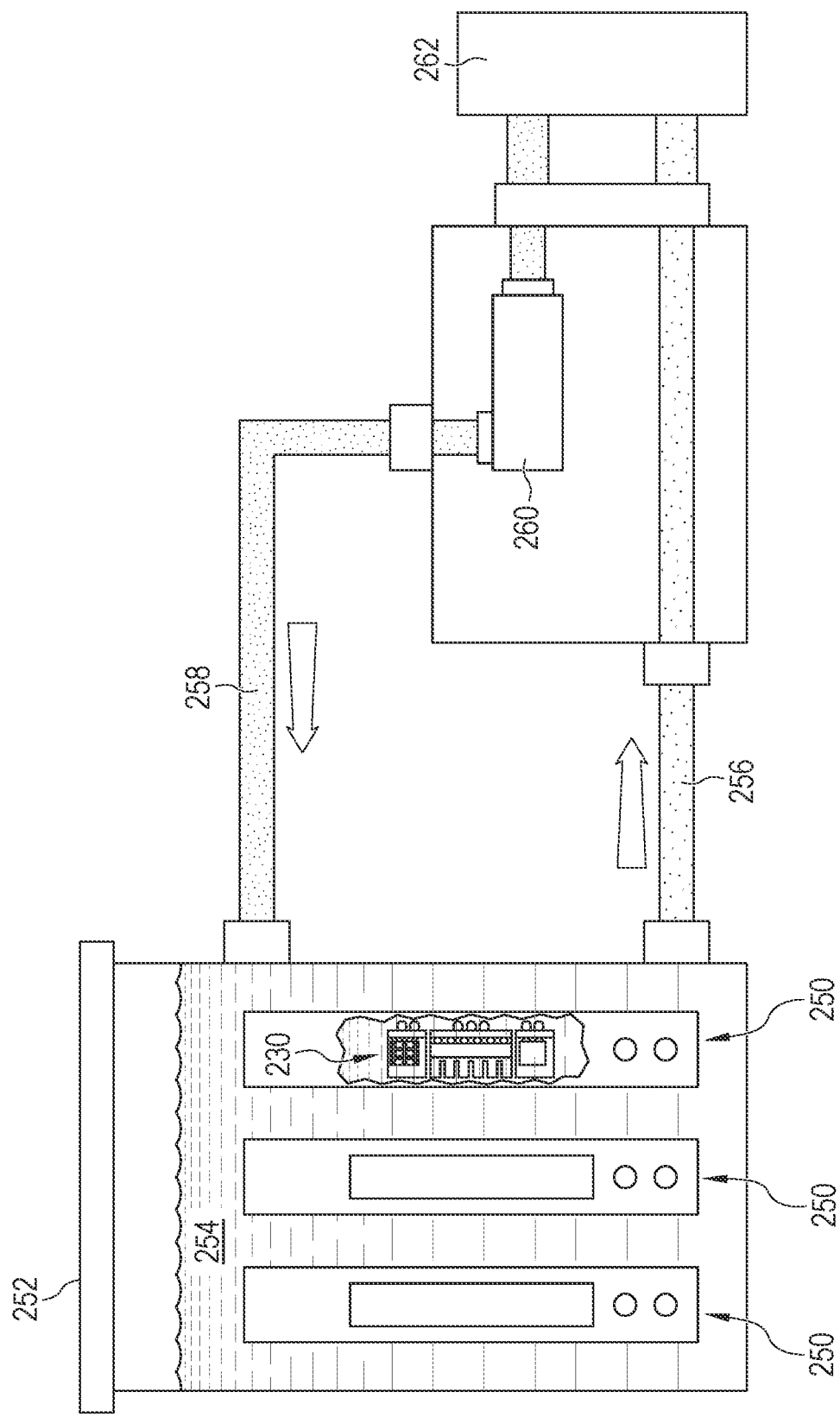
FIG. 5 illustrates using the thermally advanced semiconductor package in immersion cooling.

Water 212 flows across shielding layer 180, including into trenches 176, and absorbs thermal energy from semiconductor die 104. Trenches 176 increase the overall thermal interface surface area between water 212 and shielding layer 180. Water 212 leaving outlet 216 takes absorbed thermal energy away from package 150. The water flow circuit between outlet 216 and inlet 214 includes a pump to keep water 212 flowing and a radiator to allow the thermal energy in the water to be expelled to the ambient air. FIG. 5 below shows one embodiment of a complete circuit in a different embodiment, which could also be used with chamber 210. Any suitable water-cooling equipment or technology can be used with package 150. Water 212 can flow across the back surface of package 150 in parallel or perpendicular to trenches 176. In some embodiments, a jet plate is used to direct water 212 down into trenches 176.

Figure 4A:
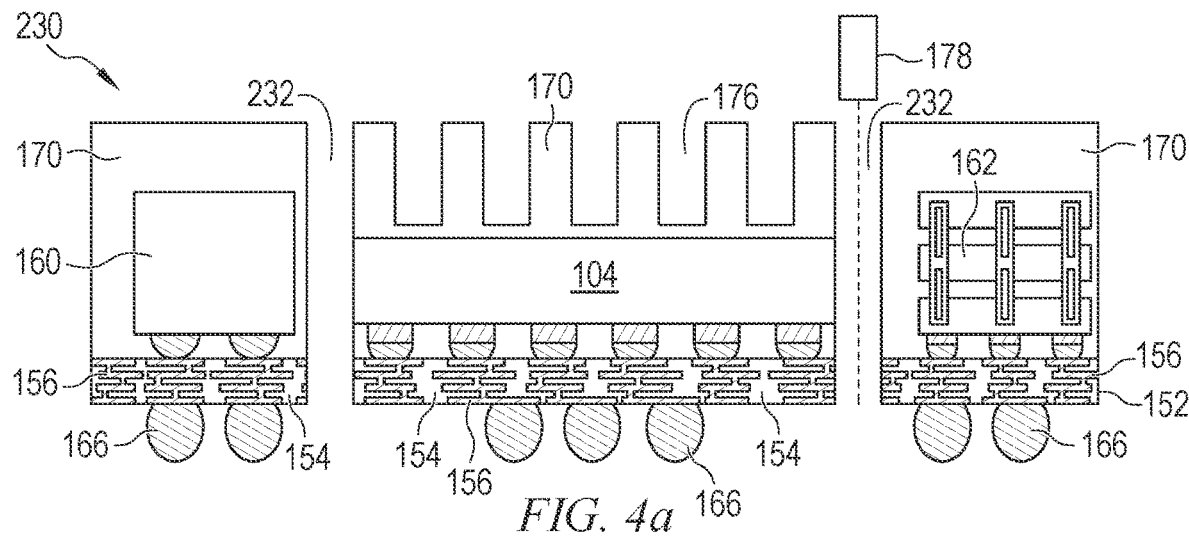
FIGS. 4a-4d illustrate a second embodiment for a thermally advanced semiconductor package.
Figure 4B:
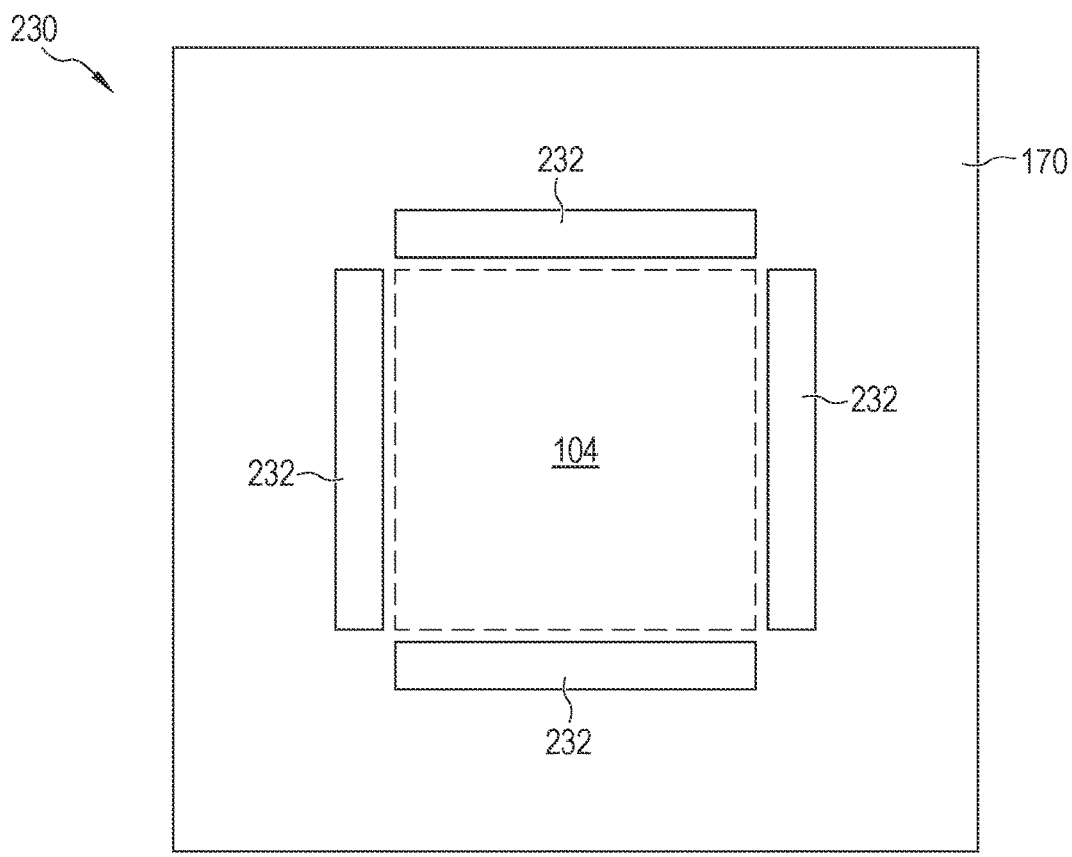
Figure 4C:
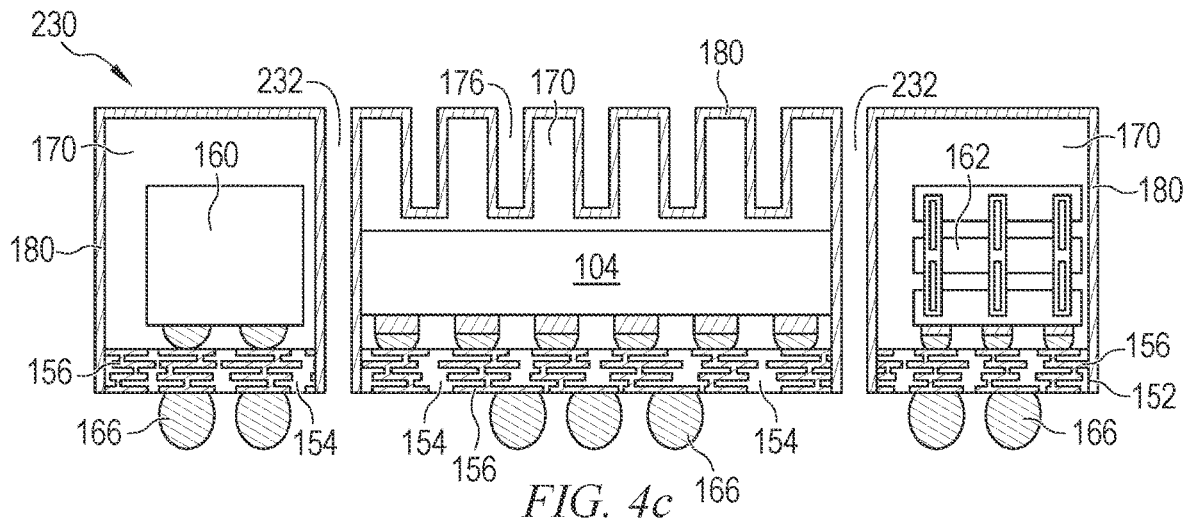

FIGS. 4a-4c illustrate formation of a second embodiment as a package 230. Similar to the above description, trenches 176 are formed in encapsulant 170 above semiconductor die 104. In addition, trenches 232 are formed completely through encapsulant 170 and substrate 152 to form a fluid pathway completely through package 230 from the top surface of the package to the bottom surface. Trenches 232 may expose a side surface of semiconductor die 104, including possibly removing a peripheral portion of the semiconductor die, or a portion of encapsulant 170 may remain between the semiconductor die and trench 232.

In one embodiment, each trench 232 is formed along a length or width of semiconductor die 104 as shown in FIG. 4b. Each trench 232 has a length that is approximately equal to a length or a width of semiconductor die 104, and spaced out from the semiconductor die so that the trenches do not physically contact each other. In other embodiments, trenches 232 are formed longer or shorter than sides of semiconductor die 232. Multiple trenches 232 can be formed along a single side of semiconductor die 104 if desired.

Figure 4D:
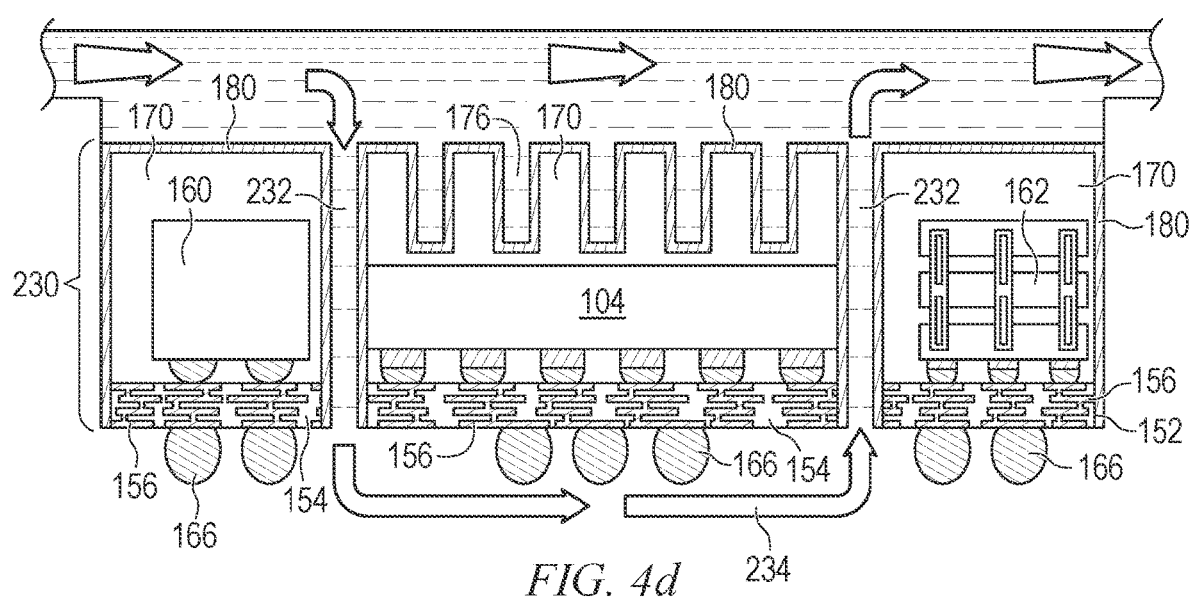

Shielding layer 180 is conformally sputtered into trenches 232 along with trenches 176 in FIG. 4c. Shielding layer 180 coats the inner surfaces of trenches 232 while still allowing water or another fluid to flow between the top and bottom sides of package 230 as illustrated in FIG. 4d. Arrow 234 indicates water 212 flowing along the bottom surface of package 230. Water 212 flows down one trench 232 and up another trench to circulate between the top and bottom sides of package 230.

Trenches 232 improve cooling by allowing more surface area of shielding layer 180 near semiconductor die 104 to absorb thermal energy. Trenches 232 also provide an increase in surface area of water 212 absorbing thermal energy by routing the water close to the side and bottom surfaces of semiconductor die 104. In some embodiments, substrate 152 includes a pattern of conductive layer 156 designed to enhance thermal transfer from semiconductor die 104 to water 212 in a similar manner to shielding layer 180, e.g., a stack of conductive layers and conductive vias extending completely through the substrate.

FIG. 5 illustrates an immersion cooling embodiment where package 230 is submerged in a coolant liquid or fluid. Server racks 250 are disposed in a tank 252 and submerged in a liquid coolant 254. Coolant 254 is a thermally conductive but electrically insulating dielectric liquid, e.g., mineral oil or fluorocarbons. Each server rack 250 includes a wide range of computer and electrical equipment, including package 230, designed to operate while submerged in coolant 254. Tank 252 includes an outlet conduit 256 where coolant 254 is drawn from the tank and an inlet conduit 258 where coolant 254 is returned into the tank. A pump 260 creates a pressure differential to circulate fluid through tank 252 and a radiator 262. Radiator 262 includes a plurality of metal fins that absorb thermal energy from coolant 254 and one or more fans to blow ambient air over the fins and transfer the thermal energy to the ambient air.

As coolant 254 flows through tank 252 from inlet conduit 258 to outlet conduit 256, the fluid flows over and through package 230, including through trenches 232. Thermal energy from semiconductor die 104 is absorbed by coolant 254 and carried out to radiator 262 to be expelled to ambient air. In some embodiments, package 230 is mounted on a printed circuit board (PCB) or other substrate with openings or slots aligned to trenches 232 to allow coolant 254 to flow without significant additional resistance from the PCB.

Figure 6A:
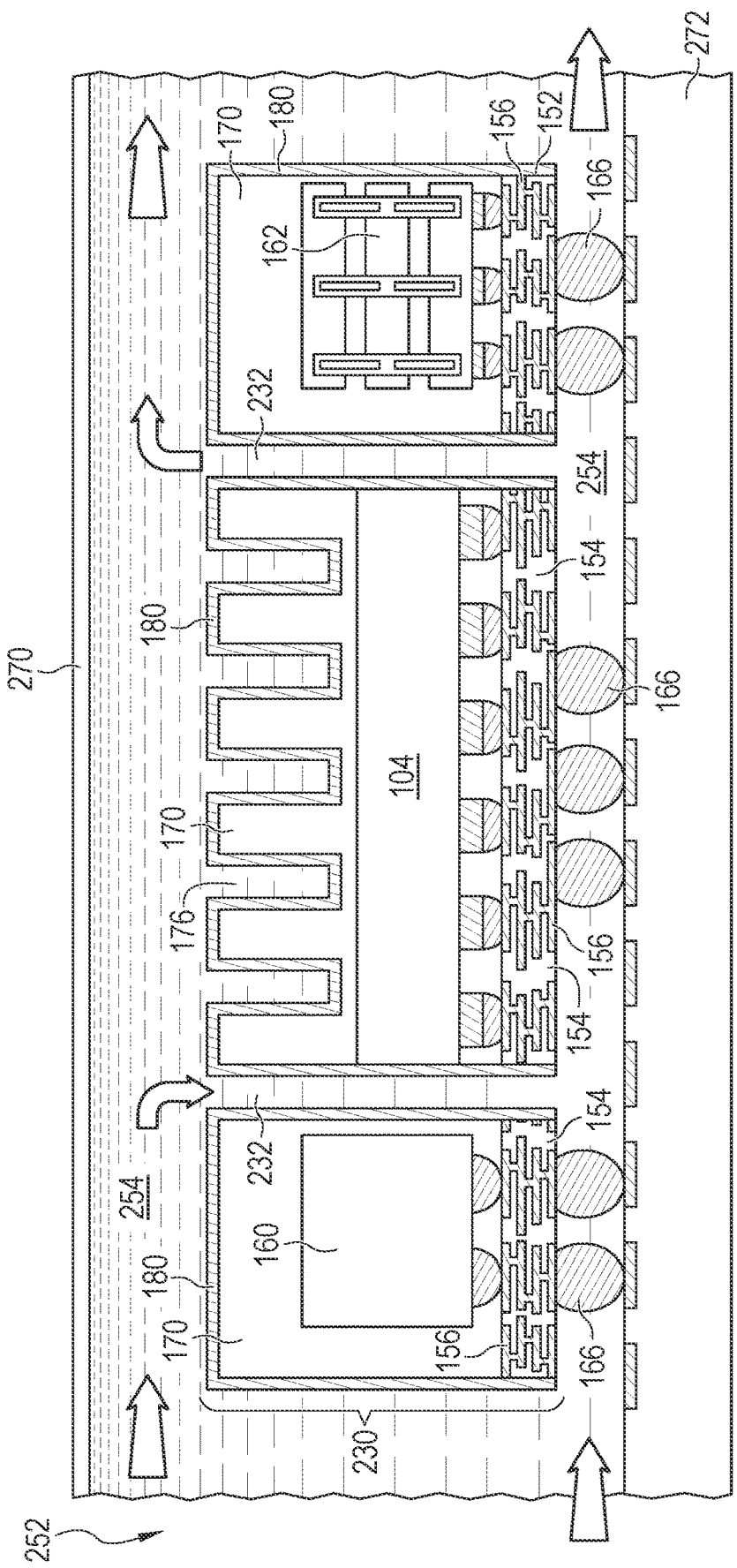
FIGS. 6a-6c illustrate options for liquid circulation cooling.
Figure 6B:
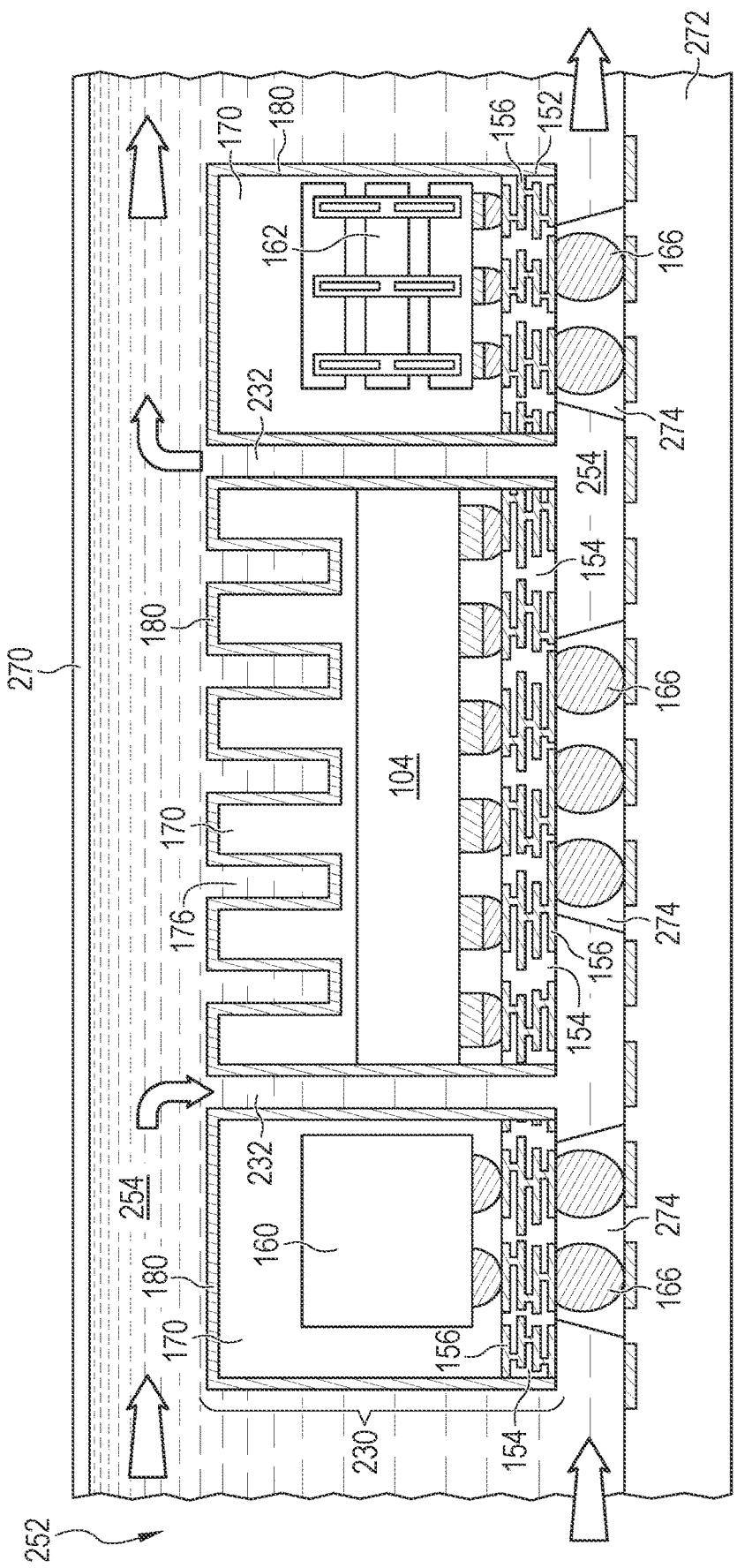
Figure 6C:
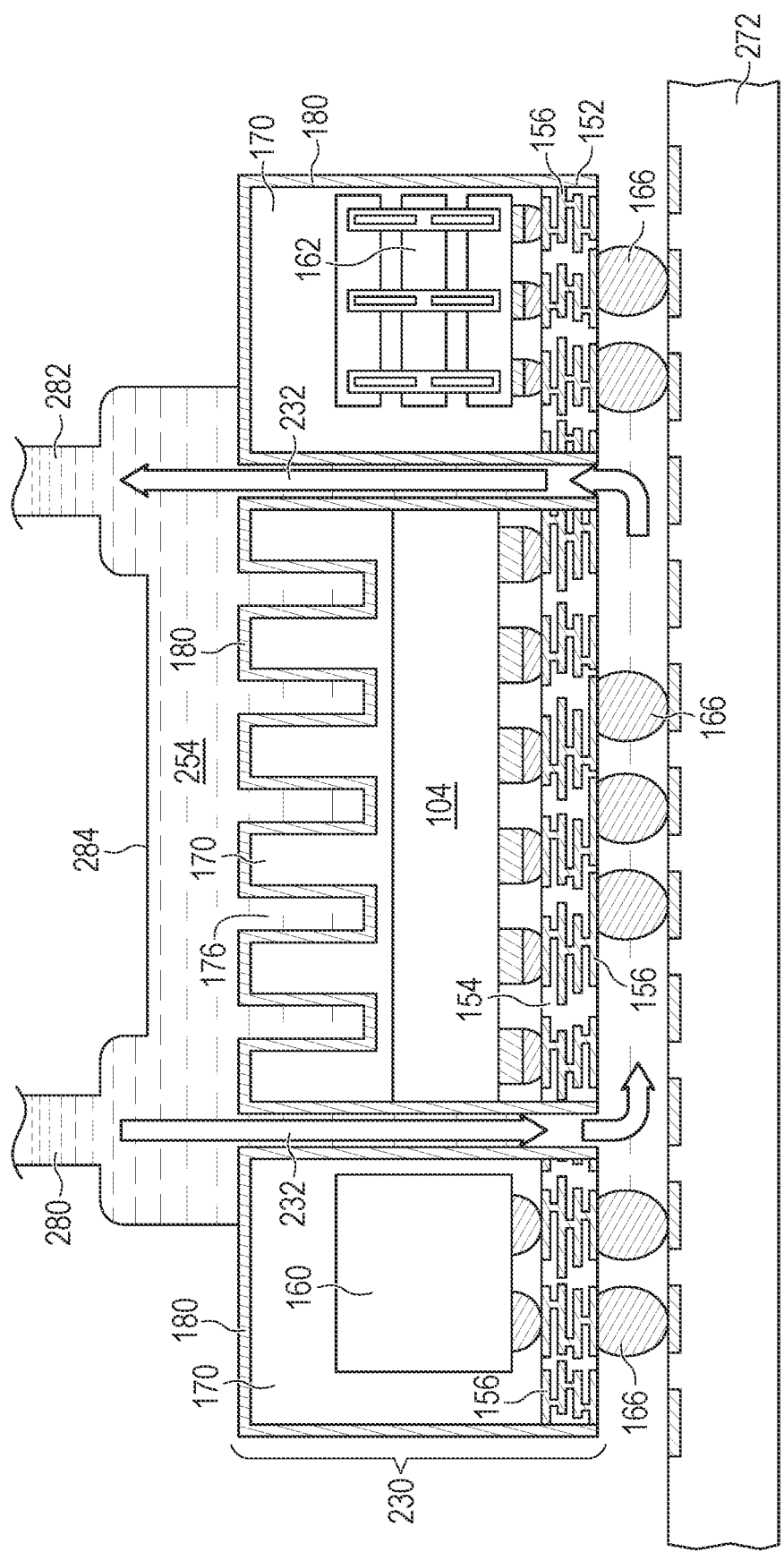

FIGS. 6a-6c illustrate additional water-cooling embodiments with trenches 232 used in liquid circulation cooling. FIG. 6a shows a horizontal flow embodiment where coolant 254 or water 212 flows horizontally across package 230. Package 230 is placed in a fluid chamber 270 that contains coolant 254 and guides the coolant across the package horizontally. As part of the flow, coolant 254 naturally flows in and out of trenches 232. Package 230 is mounted on a substrate 272 that forms part of chamber 270. In other embodiments, substrate 272 is placed within chamber 270 along with package 230. Coolant 254 flows off to the right in FIG. 6a, through a pump and radiator, then back across package 230 from the left. Thermal energy from semiconductor die 104 is constantly being absorbed by coolant 254, and then the thermal energy from the coolant is released to ambient air via the radiator.

In FIG. 6b, optional underfill 274 is added between package 230 and substrate 272. Underfill 274 protects bumps 166 from coolant 254, which could corrode or damage the bumps over time. Underfill 274 is usable with any of the above or below embodiments. Any suitable molding, underfill, adhesive, or epoxy compound can be used for underfill 274.

FIG. 6c illustrates a vertically oriented liquid circulation cooling embodiment. Coolant 254 or water 212 flows onto package 230 from inlet 280 and returns to the pump and radiator through outlet 282. Coolant 254 flows between inlet 280 and outlet 282 both above package 230 and below package 230 in parallel. The size and shape of the fluid pathway walls 284 are configured to allow approximately equal water flow between the two paths. In some embodiments, the top portion of pathway walls 284 are a sealed cap glued to the top of package 230 over trenches 232, and the bottom portion of pathway walls 284 under package 230 is an adhesive dam formed between the package and substrate 272. Coolant 254 or water 212 flowing through trenches 232 and under package 232, in parallel with flowing across the top of the package and into trenches 176, absorbs thermal energy from semiconductor die 104 and carries the thermal energy away through outlet 282. Other embodiments include a plurality of stacked packages 230 with coolant 254 flowing vertically through each of the packages in series or parallel.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate;
    disposing a semiconductor die over the substrate;
    depositing an encapsulant over the substrate and semiconductor die;
    forming a first trench in the encapsulant over the semiconductor die;
    forming a second trench completely through the encapsulant and substrate, wherein the encapsulant remains extending completely around the second trench in plan view, and wherein a side surface of the semiconductor die is exposed;
    forming a conductive layer over the encapsulant and into the first trench and second trench, wherein the conductive layer completely covers the encapsulant including covering every external surface of the encapsulant and extending continuously from within the first trench to a side surface of the substrate, and wherein the conductive layer is formed directly on the side surface of the semiconductor die; and
    guiding a flow of a liquid coolant into the first trench and second trench while the conductive layer remains completely covering the encapsulant.

2. The method of claim 1, further including immersing the semiconductor device in the liquid coolant.

3. A method of making a semiconductor device, comprising:
    providing a semiconductor package including a semiconductor die and an encapsulant deposited over the semiconductor die;
    forming a trench in the encapsulant, wherein the trench exposes a side surface of the semiconductor die, and wherein the trench is completely outside a footprint of the semiconductor die;
    forming a conductive layer over the encapsulant and into the trench, wherein the conductive layer completely covers the encapsulant including covering every external surface of the encapsulant and extending continuously from within the trench to a side surface of the semiconductor package, and wherein the conductive layer is formed directly on the side surface of the semiconductor die in the trench; and
    guiding a flow of a liquid coolant into the trench while the conductive layer remains completely covering the encapsulant.

4. The method of claim 3, further including forming the trench extending completely through the semiconductor package, wherein the encapsulant remains extending completely around the trench in plan view.

5. The method of claim 3, further including pumping the liquid coolant through a radiator.

6. The method of claim 3, further including immersing the semiconductor package in the liquid coolant.

7. A method of making a semiconductor device, comprising:
    providing a semiconductor package including,
        a substrate,
        a semiconductor die disposed over the substrate,
        an encapsulant deposited over the semiconductor die and substrate, and
        a trench formed in the encapsulant over the semiconductor die, wherein a side surface of the semiconductor die is exposed in the trench;
    forming a conductive layer over the semiconductor package and into the trench, wherein the conductive layer extends continuously from within the trench to a side surface of the semiconductor package, and wherein the conductive layer is formed directly on the side surface of the semiconductor die; and
    guiding a flow of a coolant into the trench.

8. The method of claim 7, further including:
disposing the semiconductor package over a second substrate; and
dispensing an underfill between the semiconductor package and second substrate.

9. The method of claim 7, wherein the trench extends completely through the semiconductor package.

10. The method of claim 7, further including:
coupling a pump to the trench; and
coupling a radiator to the trench and pump, wherein the coolant is configured to be cycled from the semiconductor package to the radiator by the pump.

11. The method of claim 7, further including immersing the semiconductor package in the coolant.

12. A method of making a semiconductor device, comprising:
providing a semiconductor package including,
a semiconductor die,
a trench formed in the semiconductor package, wherein a surface of the semiconductor die is exposed in the trench, and
a conductive layer formed over the semiconductor package and into the trench, wherein the conductive layer extends continuously from within the trench to a side surface of the semiconductor package, and wherein the conductive layer is formed on the surface of the semiconductor die; and
guiding a flow of a coolant into the trench.

13. The method of claim 12, further including:
disposing the semiconductor package over a second substrate; and
dispensing an underfill between the semiconductor package and second substrate.

14. The method of claim 12, wherein the trench extends completely through the semiconductor package.

15. The method of claim 12, further including:
coupling a pump to the trench; and
coupling a radiator to the trench and pump, wherein the coolant is configured to be cycled from the semiconductor package to the radiator by the pump.

16. The method of claim 12, further including immersing the semiconductor package in the coolant.

\* \* \* \* \*